United States Patent
Nakanishi et al.

[19]

[11] Patent Number: 6,033,471
[45] Date of Patent: Mar. 7, 2000

[54] METALLIC THIN FLIM AND METHOD OF MANUFACTURING THE SAME, AND SURFACE ACOUSTIC WAVE DEVICE USING THE METALLIC THIN FILM AND THE METHOD THEREOF

[75] Inventors: Hidefumi Nakanishi, Shiga-ken; Atsushi Sakurai, Kyoto; Masato Kobayashi, Ohmihachiman; Yukio Yoshino, Ohtsu, all of Japan

[73] Assignee: Murata Manufacturing Co., Ltd., Japan

[21] Appl. No.: 08/786,410

[22] Filed: Jan. 21, 1997

[30] Foreign Application Priority Data

Jan. 19, 1996 [JP] Japan ................................ 8-006963
Jan. 19, 1996 [JP] Japan ................................ 8-006964

[51] Int. Cl.$^7$ ................................................. C30B 23/08
[52] U.S. Cl. ......................... 117/108; 117/109; 117/938; 204/192.17
[58] Field of Search ..................... 204/192.17; 117/108, 117/109, 938, 939

[56] References Cited

U.S. PATENT DOCUMENTS 4,325,776  4/1982  Menzel .
5,152,864  10/1992  Ieki et al. ................................ 117/108
5,262,361  11/1993  Cho et al. ............................... 117/108
5,449,641  9/1995  Maeda ................................ 204/192.17
5,558,711  9/1996  Sakurai .................................. 117/108
5,711,858  1/1998  Kontra et al. ...................... 204/192.17
5,747,360  5/1998  Nulman ............................... 204/192.17

FOREIGN PATENT DOCUMENTS 0269111  6/1988  European Pat. Off. .
0534354  3/1993  European Pat. Off. .
0036580  of 1989  France .
5152884  6/1993  Japan .

OTHER PUBLICATIONS

1046 Journal of the Electrochemical Society 138(1991) Apr., No. 4, Manchester, NH, US.

*Primary Examiner*—Robert Kunemund
*Attorney, Agent, or Firm*—Ostrolenk, Faber, Gerb & Soffen, LLP

[57] ABSTRACT

By using a dual ion-beam sputtering apparatus, an aluminum thin-film is formed on a glass substrate made of an amorphous material. While radiating an ion beam for assisting the film formation from an ion source onto the glass substrate, the aluminum thin-film is formed by depositing the sputtering ions which are generated by radiating an ion beam onto an aluminum target.

10 Claims, 1 Drawing Sheet

METALLIC THIN FLIM AND METHOD OF MANUFACTURING THE SAME, AND SURFACE ACOUSTIC WAVE DEVICE USING THE METALLIC THIN FILM AND THE METHOD THEREOF

BACKGROUND OF THE INVENTION

1. Field of the Invention

The present invention relates to a metallic thin-film applied to electrodes of various kinds of electronic parts and also relates to a method of manufacturing the metallic thin-film.

2. Description of the Related Art

As a result of the recent advances, the size of various types of electronic components such as capacitors, LSIs, coils, filters and oscillators have been reduced. This has made it necessary to provide thin-film electrodes for these components (such films are typically formed of aluminum or the like) which exhibit increased resistance to electric power. The crystallinity of such thin-films largely affects their resistance to electric power. When the thin-film material is polycrystalline or amorphous, atoms diffuse within grain boundaries under a high current density or a high stress which forms voids or hillocks in the thin-film. These voids or hillocks cause short circuits or disconnection. This phenomenon is referred to as electromigration or stressmigration.

To avoid this problem, it is necessary to create monocrystalline structures which do not have the grain boundaries which serve as diffusion paths for the atoms. However, it is impossible to create such a mono-crystalline structure on a surface of an amorphous body, a polycrystalline body, or an orientation layer of a polycrystalline body by conventional film-forming methods.

SUMMARY OF THE INVENTION

The process of the present invention provides a metallic thin-film which is entirely or partially mono-crystalline in structure formed on the surface of a support body which has an amorphous or a polycrystalline structure, or which has a polycrystalline orientation layer, and a method for manufacturing such metallic thin-films.

In the preferred embodiment, the thin film electrode is arranged for use in a surface acoustic wave device which better withstands electric power than the prior art devices.

In accordance with the preferred embodiment, a metallic thin-film of the present invention has an entirely or partially mono-crystalline structure, and is formed on the surface of an amorphous body, a polycrystalline body, or an orientation layer of a polycrystalline body, under the influence of a radiated beam which assists the film formation onto the surface of the amorphous body, the polycrystalline body, or the orientation layer.

Preferably, at least one type of ion selected from the group consisting of argon, helium, neon, krypton, and xenon ions, or a mixture thereof is used for the irradiating ion beam. The metallic thin-film is preferably composed of aluminum, gold, silver, copper, platinum, titanium, chromium, nickel, tungsten, an alloy thereof, or an alloy essentially consisting of at least one of the above elements.

According to one aspect of the present invention, there is provided a thin film electrode for use in a surface acoustic wave device and a surface acoustic wave device comprising an amorphous layer formed on a piezoelectric substrate, and at least one of a single crystal layer and an oriented layer formed on the amorphous layer.

According to another aspect of the present invention, there is provided a method of forming a surface acoustic wave device having a thin film electrode formed thereon, the method comprising the steps of forming an amorphous layer on a surface of a piezoelectric substrate while irradiating the surface of the piezoelectric substrate with an ion beam, and thereafter forming at least one of a single crystal layer and an oriented layer on a surface of the amorphous layer with the assist ion beam.

BRIEF DESCRIPTION OF THE DRAWINGS

For the purpose of illustrating the invention, there is shown in the drawing a plurality of forms which are presently preferred, it being understood, however, that the invention is not limited to the precise arrangement and instrumentalities shown.

DESCRIPTION OF THE PREFERRED EMBODIMENT

First Embodiment

The present invention will be better understood from the following description of the preferred embodiment of a metallic thin-film and a method of manufacturing the film taken in conjunction with the accompanying drawings. According to the a first embodiment of the present invention, a (111) orientated aluminum thin-film is formed on a glass substrate 12.

Figure 1:
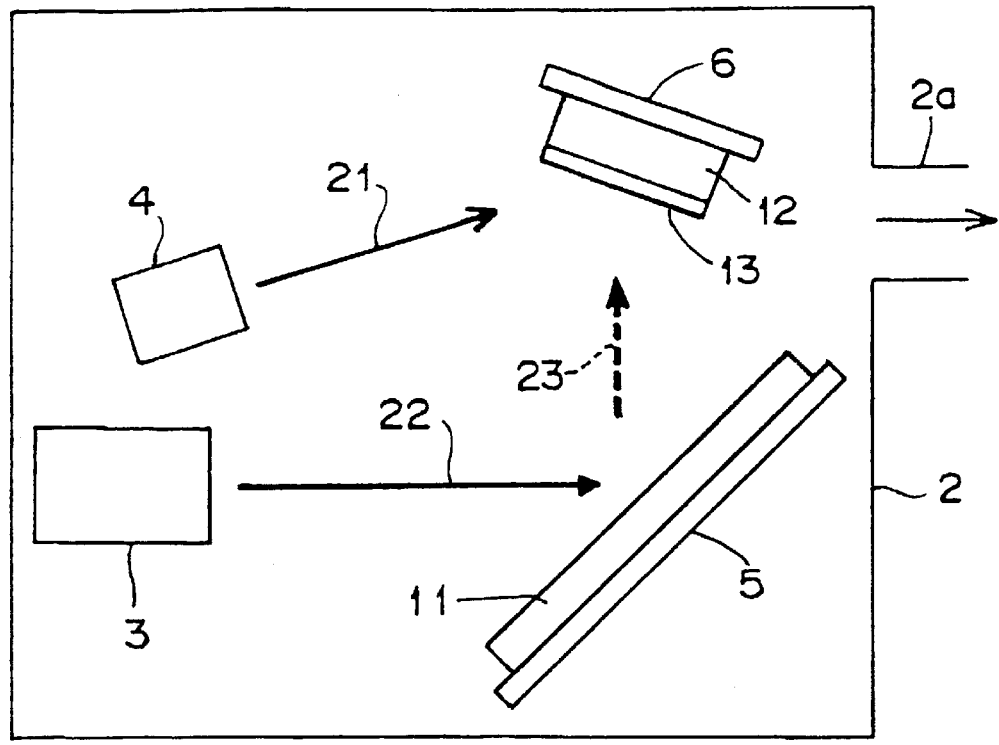
FIG. 1 is a diagram of an apparatus for manufacturing metallic thin-films, which apparatus illustrates an embodiment of a metallic thin-film and a method of manufacturing the film incorporated in the present invention.

FIG. 1 shows a dual ion-beam sputtering apparatus 1 for forming a film on the glass substrate 12. The dual ion-beam sputtering apparatus 1 includes a vacuum chamber 2 and a vacuum pump (not shown in the figure) connected to an exhaust port 2a provided in the right wall of the vacuum chamber 2. Inside the vacuum chamber 2, an ion source 3 for sputtering and an ion source 4 for assisting the film formation are positioned on the left side, and a backing plate 5 and a substrate support 6, which is located above the backing plate 5 are positioned on the right side.

A thin-film is deposited using the sputtering apparatus 1 as follows. An aluminum target 11, which acts as a sputtering material, is fixed to the surface of the backing plate 5 using a brazing filler metal such as indium. A glass substrate 12 (i.e., of an amorphous material) is fixed onto the surface of the substrate support 6. Air in the vacuum chamber 2 is evacuated to preferably 0.1 Pa or less from the exhaust port 2a using the vacuum pump. If the vacuum exceeds 0.1 Pa, the resulting thin-film will contain residual gases, such as $H_2O$. In this embodiment, the vacuum chamber 2 is maintained at $5 \times 10^{-3}$ Pa.

A so-called "ion assisting" process is conducted by radiating an ion beam 21 which assists the formation of a thin film onto the surface of the glass substrate 12, and is continued until the completion of the formation of the film. The preferred energy for the ion beam 21 is from 100 eV to 1 KeV. If the energy is less than 100 eV, sufficient energy cannot be provided for the atoms in the thin-film 13, while energy above 1 KeV is exceedingly high so that the ion beam 21 disadvantageously sputters and disperses the atoms in the thin-film 13 deposited on the surface of the glass substrate 12, thus preventing the thin-film from growing.

The preferred current density of the ion beam 21 is 0.01 to 20 mA/cm$^2$. If the current density is less than 0.01 mA/cm$^2$, sufficient energy cannot be provided for the atoms in the thin-film 13, while a current density above 20 mA/cm$^2$ is exceedingly high so that the ion beam 21 disadvantageously sputters and disperses the atoms in the thin-film 13 deposited on the surface of the glass substrate 12, thus preventing the thin-film from growing. The incident angle of the ion beam 21 to the glass substrate 12 is preferably set within a range of from 0° to 45° with respect to a line which is normal to the surface of the glass substrate 12. If the incident angle does not fall within the above angle range, it becomes difficult to efficiently provide energy for the atoms in the thin-film 13.

Figure 2:
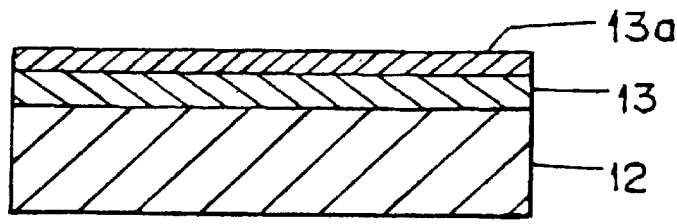
FIG. 2 is a sectional diagram of a single-crystallized metallic thin-film formed on the surface of an amorphous body.

An argon ion-beam is preferably radiated onto the aluminum target 11 from the ion source 3 for sputtering. The argon ions collide with the aluminum target 11 to disperse ions 23 therefrom. These ions 23 reach the surface of the glass substrate 12 and are deposited thereon to form an aluminum thin-film 13. The film-forming speed is preferably 0.001 nm/sec or more. When the speed is less than 0.001 nm/sec, the atoms in the thin-film 13 aggregate, resulting in grain growth. In the present embodiment, film-forming is conducted at 0.06 nm/sec and at 25° C. Since the glass substrate 12 is made of an amorphous material, the aluminum thin-film 13 does not have a mono-crystalline atomic structure in the initial stage of the film formation. However, the influence of the glass substrate 12 disappears and the thin-film 13 can attain a mono-crystalline atomic structure when several atomic layers have been deposited. After film-forming, the glass substrate 12 is removed from the vacuum chamber 2. The surface of the aluminum thin-film 13 deposited on the surface of the substrate 12 may form an oxidized layer 13a by contact with an oxygen atmosphere, as is shown in FIG. 2.

The resulting aluminum thin-film 13 was confirmed to have a mono-crystalline structure based on evaluation according to the Rheed method. Therefore, the grain-boundary diffusion of atoms under high current-density or high stress is preventable by employing the aluminum thin-film 13, resulting in a reliable electrode. For example, the resistance of the aluminum thin-film 13 to electric power is approximately 100 times that of a polycrystalline aluminum thin-film.

The aluminum thin-film 13 has a small degree of lattice defects and exhibits excellent corrosion resistance such that the number of corroded portions decreases to approximately one tenth that of a polycrystalline aluminum thin-film. Thus, in addition to the usage as an electrode material, the thin-film of the present invention can be advantageously employed as, for example, a thin-film material for ornamental articles such as mirrors and a thin-film material used in a chloride atmosphere such as on the seashore or in the sea.

A metallic thin-film and a method of manufacturing the film incorporated in the present invention may be embodied in other specific forms without departing from the spirit or essential characteristics thereof. The present embodiment is therefore to be considered in all respects as illustrative and not restrictive.

Besides the argon ions, helium, neon, krypton, or xenon ions may be employed alone or in combination for the ion beam 21 for assisting the film formation. Gold, silver, copper, platinum, titanium, chromium, nickel, tungsten, an alloy thereof, or an alloy essentially consisting of at least one of the above elements may be employed as the thin-film material, in addition to aluminum. Additionally, the sputtering conditions vary according to the combination of the thin-film material and an amorphous body or the thin-film material and a polycrystalline body or an orientation layer of a polycrystalline body.

Although a (111) oriented aluminum thin-film is formed on a glass substrate in the above embodiment, the orientation direction of the thin-film is optional and, for example, a (200) oriented aluminum thin-film may be formed. A boron nitride substrate or the like may be used besides the glass substrate. Further, the thin-film of the present invention may be formed on a thin-film instead of the substrate. It is not necessary that the substrate on which the thin-film is formed is entirely amorphous, as long as the surface thereof is amorphous. Moreover, the substrate may be a polycrystalline body or comprise an orientation layer. As a film-forming method, evaporation, chemical vapor deposition, molecular beam epitaxy, laser ablation, or the like may be employed in addition to sputtering. Furthermore, the metallic thin-film is not required to be entirely mono-crystalline in structure, as long as it is partially mono-crystalline in structure.

Second Embodiment

A thin film electrode for use in a surface acoustic wave device, a surface acoustic wave device, and a method of forming the thin film electrode and the surface acoustic wave device which represent an embodiment of the present invention will be described. The embodiment will be performed with respect to a case of forming a (111)-oriented aluminum thin film on a lithium tantalate substrate in the same method and conditions as in the first embodiment.

Figure 3:
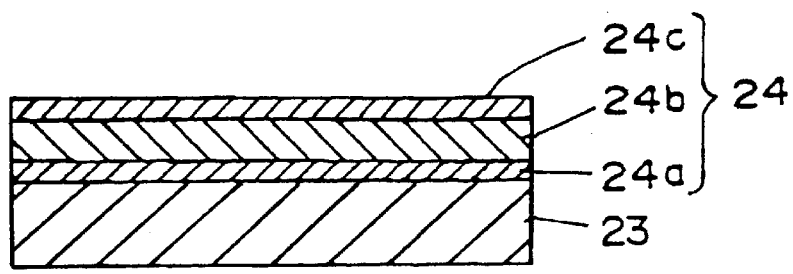
FIG. 3 is a cross-sectional view of the thin film electrode, including a single crystal structure or an orientation layer structure, which is formed on the surface of the piezoelectric substrate.

FIG. 3 shows a cross-sectional view of a thin film electrode 24 of a surface acoustic wave device according to the present invention. The thin film electrode 24 is formed, for example, as a planar comblike IDT (interdigital transducer) electrode by sputtering on the substrate on which masking was performed or by etching the thin film electrode which was formed on the entire surface of the substrate.

At an initial stage of the formation of aluminum thin film 24, under the influence of the ion assist, thin film 24 forms an amorphous layer 24a as shown in FIG. 3. As the film formation progresses further, thin film 24 forms a mono-crystalline layer (or highly-oriented layer) 24b. After the thin film formation, when the substrate 23 having aluminum thin film 24 formed on its substrate is taken out of the vacuum chamber 2, an oxide layer 24c is formed in the surface of the aluminum thin film 24 brought in contact with air.

As described above, according to the present invention, an entirely or partially mono-crystalline metallic thin-film is formed on the surface of an amorphous body, a polycrystalline body, or an orientation layer of a polycrystalline body, while radiating an ion beam for assisting the film formation onto the surface of the amorphous body, the polycrystalline body, or the orientation layer. Since the resulting metallic thin-film contains a mono-crystalline structure, the grain boundary diffusion of atoms under high current density or high stress is preventable. Furthermore, the metallic thin-film has a small degree of lattice defects and exhibits excellent corrosion resistance. Thus, a reliable electrode can be obtained by using the metallic thin-film.

What is claimed is:

1. A method of forming a thin film electrode for use in a surface acoustic wave device, said method comprising the steps of:

forming an amorphous layer of an electrode material on a surface of a piezoelectric substrate while irradiating said surface of the piezoelectric substrate with an ion beam; and forming at least one of a single crystal layer of said electrode material and an oriented layer of said electrode material on a surface of said amorphous layer while irradiating said surface of said amorphous layer with said ion beam.

2. A method according to claim 1, wherein said ion beam is selected from the group consisting of argon, helium, neon, krypton, xenon ions, or a mixture thereof.

3. A method according to claim 1, wherein said electrode material is selected from the group consisting of aluminum, gold, silver, copper, platinum, titanium, chromium, nickel, tungsten, an alloy thereof or an alloy essentially consisting of at least one of said elements.

4. A method of forming surface acoustic wave device, said method comprising the steps of:

forming an amorphous layer of an electrode material on a surface of a piezoelectric substrate while irradiating said surface of said piezoelectric substrate with an ion beam; and forming at least one of a single crystal layer of said electrode material and an oriented layer of said electrode material on a surface of said amorphous layer while irradiating the surface of said amorphous layer with said ion beam.

5. A method according to claim 4, wherein said ion beam is selected from the group consisting of argon, helium, neon, krypton, xenon ions, or a mixture thereof.

6. A method according to claim 4, wherein said electrode material is selected from the group consisting of aluminum, gold, silver, copper, platinum, titanium, chromium, nickel, tungsten, an alloy thereof or an alloy essentially consisting of at least one of said elements.

7. A method of forming a thin film electrode for use in a surface acoustic wave device, said method comprising the steps of:

ion-beam sputtering an amorphous layer of an electrode material on a surface of a piezoelectric substrate;

ion-beam sputtering at least one of a monocrystal layer and an oriented layer of said electrode material on a surface of said amorphous layer; and radiating an ion beam towards said surface of said substrate during said ion-beam sputtering steps so as to assist in said formation said layers.

8. A method according to claim 7, wherein said radiating step is carried out during the entire duration of said ion-beam sputtering step.

9. A method according to claim 7, wherein said ion beam is selected from the group consisting of argon, helium, neon, krypton, xenon ions, or a mixture thereof.

10. A method according to claim 7, wherein said electrode material is selected from the group consisting of aluminum, gold, silver, copper, platinum, titanium, chromium, nickel, tungsten, an alloy thereof or an alloy essentially consisting of at least one of said elements.

* * * * *